United States Patent [19]
Jones et al.

[11] Patent Number: 5,903,165
[45] Date of Patent: *May 11, 1999

[54] PROGRAMMABLE LOGIC ARRAY WITH A HIERARCHICAL ROUTING RESOURCE

[75] Inventors: Gareth James Jones, Manchester; Gordon Stirling Work, Warrington, both of United Kingdom

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/253,041

[22] Filed: Jun. 2, 1994

[30] Foreign Application Priority Data

Jun. 18, 1993 [GB] United Kingdom .................. 9312674

[51] Int. Cl.$^6$ ........................... H03K 19/177; H03K 7/38
[52] U.S. Cl. .................. 326/39; 326/41; 326/93
[58] Field of Search ................. 326/39, 40, 41, 326/93, 95, 98

[56] References Cited

U.S. PATENT DOCUMENTS

| | | | |
|---|---|---|---|
| 4,864,381 | 9/1989 | Seefeldt et al. | 326/39 |
| 5,109,353 | 4/1992 | Sample et al. | 364/578 |
| 5,140,184 | 8/1992 | Hamamoto et al. | 326/93 |
| 5,208,491 | 5/1993 | Ebeling et al. | 326/39 |
| 5,218,240 | 6/1993 | Camarota et al. | 326/39 |
| 5,341,049 | 8/1994 | Shimizu et al. | 326/41 |
| 5,455,525 | 10/1995 | Ho et al. | 326/39 |
| 5,457,410 | 10/1995 | Ting | 326/41 |
| 5,469,003 | 11/1995 | Kean | 326/39 |
| 5,519,629 | 5/1996 | Snider | 326/38 |
| 5,528,176 | 6/1996 | Kean | 326/41 |

FOREIGN PATENT DOCUMENTS

| | | |
|---|---|---|
| 0 177 261 | 4/1986 | European Pat. Off. . |
| 0 281 215 | 9/1998 | European Pat. Off. . |
| WO 88/0372 | 5/1988 | WIPO . |

Primary Examiner—Michael J. Tokar
Assistant Examiner—Richard Roseen
Attorney, Agent, or Firm—Robert D. Atkins

[57] ABSTRACT

A configurable semi-conductor integrated circuit has an area thereof formed with a plurality of logic circuits at discrete sites or cells respectively defining a matrix array of cells. The matrix array of cells is subdivided at least into zones, each having a matrix array of cells, and further includes a porting arrangement for each zone; and a hierarchical routing resource structure including: (i) global connection paths having selectable connections with the porting arrangement of each zone and which extend continuously across more than one zone, (ii) medium connection paths extending from the porting arrangement and selectably connectable with at least some of the cells in a zone, and (iii) local direct connection paths having for each cell a restricted signal translation system between inputs and outputs of the cells and defining first and second sets of logic circuits.

20 Claims, 12 Drawing Sheets

PROGRAMMABLE LOGIC ARRAY WITH A HIERARCHICAL ROUTING RESOURCE

BACKGROUND OF THE INVENTION

The present invention relates to semi-conductor integrated circuits of the type comprising configurable logic circuit arrays.

The invention is a development of the configurable logic circuit arrays disclosed in our British Patent Specification No. 2180382 (having a corresponding U.S. Pat. No. 4,935,734) and U.S. Pat. No. 5,001,368. In the former, the logic circuit array comprises a matrix of discrete sites or cells at each of which is a logic circuit which is adapted to perform a simple logic function. Typically the simple logic function is implemented by means of a two input NAND gate. As made each logic circuit has what may be referred to as a restricted signal translation system by which each logic circuit has selectable direct connection paths to only a few of the other logic circuits. More particularly each direct connection path which is selectable as to its conduction state, extends, for each said logic circuit, from its output to inputs of a first set of some of other said logic circuits and from its inputs to outputs of a second set of some of other said logic circuits, all of the sets (for all of the logic circuits) each being unique. Such a restricted signal translation system provides what can be conveniently referred to as local direct connection paths.

An array of this type is capable of being programmed in such a manner as to configure the various NAND gates, as required, to perform various and different logic functions. One such function is known as a latching function and in the logic array as disclosed in Specification No. 2180382, a latching function may be implemented using four NAND gates. This has the disadvantage that the greater the number of latching functions that may be required from any logic array, the fewer NAND gates remain for other required functions. This has the effect of reducing the overall effectiveness of the array.

The invention of U.S. Pat. No. 5,001,368 overcomes this disadvantage by providing an additional logic circuit for inclusion in each of the logic circuits at each discrete site to enable each site to have a greater programmable facility and thereby increase the overall utilisation of the array. As with GB 2180382 the site/cell of each logic circuit has the aforesaid restricted signal translation system. Each additional logic circuit is arranged within the logic circuit of the site or cell to be selectively controlled by control means to cause each logic circuit and additional logic circuit comprising each cell to operate as either a first or a second different simple logic function. More particularly, each cell is constructed to operate as a NAND gate or as a latch circuit function.

Providing such local direct connection paths between physically neighbouring logic circuit sites facilitates the establishment of a desired particular circuit function in a localised configuration of logic circuits, ie. in part only of the chip area occupied by an appropriate number of discrete sites of the logic circuits and by the direct connection paths. Interconnections between such localised configurations for overall circuit/system requirements can be either simply by said direct connection paths or by a further signal translation system by way of a direct connection bus directly connected to the logic circuits and extending throughout the array—for example as a series of rows and columns. Such connections might conveniently be referred to as global connections.

The so-called local direct connections and global connections constitute routing resources which are used to connect to discretely programmed logic functions. These resources can be combined by routing through a cell in order to complete the connection between functions. Once a logic circuit has been used in this matter to complete the routing that logic circuit can no longer be used for function. This reduces the overall effectiveness of the array. An object of one aspect of this invention is to overcome this disadvantage by providing additional connection resources in an arrangement not previously contemplated.

A feature of the afore-described configurable logic arrays is that each discrete site or cell is identical thus in the case of GB 2180382 each discrete site comprises a NAND gate whilst in the case of U.S. Pat. No. 5,001,368 each discrete cell comprises a NAND gate and an additional logic circuit which enables the cell to function exclusive as a NAND gate or exclusively as a latch circuit function Implementing other circuit functions (be they logic functions or otherwise) requires the various cells to be configured as required to perform various and different circuit functions Other functions frequently required are XOR and D-flip-flop. Again this has the disadvantage that the greater number of these functions that may be required from any logic array the fewer gates remain for other required functions which has the effect of reducing the overall effectiveness of the array

SUMMARY OF THE INVENTION

An object of one aspect of this invention is to overcome this disadvantage by providing a series of different types of cells (eg. providing different functions) and arranged in a particular manner in the array to thereby increase the overall utilisation of the array.

According to said one aspect of the invention a semiconductor integrated circuit comprises an area thereof formed with a plurality of logic circuits at discrete sites or cells respectively defining a matrix array of cells, and wherein the matrix array of cells is sub-divided at least into zones each comprising a matrix array of said cells and further comprising a porting arrangement for each zone, the integrated circuit as made having an hierarchical routing resource structure comprising:

(i) global connection paths having selectable connections with the porting arrangement of each zone, (ii) medium connection paths extending between the porting arrangement and at least some of the cells in a zone, and (iii) local direct connection paths comprising for each cell a restricted signal translation system between inputs and outputs of the cells each selectable as to its conduction state, those paths extending for each said logic circuit from its output to inputs of a first set of some of other said logic circuits and from its inputs to outputs of a second set of some of other said logic circuits, each first set of logic circuits being different from any other first set of logic circuits, and each second set of logic circuits being different from any other second set of logic circuit.

In essence the present invention provides a semiconductor integrated circuit comprising an area thereof formed with a plurality of logic circuits at discrete sites with three levels of interconnect, namely global, medium and local, and are brought about by the existence of the porting arrangement that separates the array into zones. The global level interconnect can span the whole array but is separated from the medium and local level interconnects by the porting arrangement, the medium interconnect extend at a zone but can connect directly with port cells and core cells, whilst the local interconnect provides connections between only a few cells.

The zones are preferably arranged in a matrix array of zones, the plurality of zones defining a quadrant and the integrated circuit may have a plurality of quadrants also conveniently arranged in a matrix array. In a preferred construction there are 10×10 cells to a zone and 5×5 zones to a quadrant and 2×2 quadrants. The global connection paths conveniently extend horizontally and vertically across a plurality of zones. Indeed it is preferable to have the global connection paths comprise lines which extend continuously across more than one zone and which are selectably connectable with at least some of the zones. Preferably there are a plurality of global connection paths for each row and column of cells in a zone. More preferably still there are four global connection paths for each row and column of cells.

As concerns the medium connection paths, it is preferred to have a plurality of these for each row and column of cells of a zone, and preferably four for each row and column. Each medium connection path is selectably connectable with an output and/or input of one or more cells.

Preferably the semi-conductor integrated circuit comprises further global routing resources comprising horizontal and vertical buses extending across a zone horizontally and vertically respectively, and which are connectable with the port cells and with one another. It is preferred that they are not connectable to the cells. Conveniently there is one such additional global connection bus for each row and column of cells, and preferably there is a connection between the horizontal and vertical buses for each cell. Conveniently such additional global connection paths are referred to as x buses.

It is convenient to have horizontal and vertical port cells. The porting arrangement permits resources to be routed from the global lines through to the medium lines and thereby into the cells without necessarily having to use cells for routing thereby leaving more cells available for function.

The use of port cells is also advantageous in that it allows the general interconnect structure (global and medium buses) to interconnect with special interconnect structure, for example clocks and tristates.

Accordingly, the circuit advantageously further comprises clock distribution channels, preferably comprising-a vertical clock bus (with say 8 lines) extending between clock pads to top and bottom of the array, a horizontal clock distribution spine (with say 8 lines), extending between clock pads to opposite sides of the array and intersecting with the vertical clock bus. Preferably there is a vertical clock distribution spine for each zone (conveniently tapped off from the horizontal clock spine) by which clock and reset signals are distributed to the vertical port cell of that zone. Preferably alternate core cells have clock and reset signal lines. Buffers are used in the clock signal distribution lines as appropriate.

Further advantageous of signal paths arise from dedicated connection lines with the horizontal port cells, specifically wired -OR buses (say 5) running across each zone and connecting directly with the wired -OR core cells. Preferably connection of the wired -OR buses may be made to a certain (restricted) number of global buses, eg. by way of the horizontal port cells. A further advantageous feature is to have wired -OR connections between horizontal x buses and say three horizontal global buses. Pull ups are advantageously provided for the WO buses, eg. in the horizontal port cells, and pull ups for the global buses are advantageously situated in the vertical inter-quadrant region .

The preferred connection provisions afforded by the porting arrangement will be described further hereinafter, along with other features of the integrated circuit.

According to said another aspect the invention provides a configurable semi-conductor integrated circuit comprising a matrix array of core cells each of the cells having a first simple function in common and at least one subsidiary function, there being at least two different subsidiary functions, the core cells being grouped in tiles comprising a matrix array of the core cells and wherein each tile has at least one of each different subsidiary functions.

The tiles comprise a matrix array of the core cells smaller than the whole array The arrangements of subsidiary functions within the cells of the tile are substantially different The resultant tile of core cells is arranged so as to uniformly cover the array Said another aspect the invention has a particular application with the circuit configuration described in the aforesaid British Patent No. 2180302. Accordingly in that application said another aspect may be defined by a configurable semi-conductor integrated circuit which comprises an area thereof formed with a plurality of logic circuits at discrete sites or cells respectively, each said logic circuit having in common a restricted simple logic function capability and itself only being capable of implementing a simple logic function, and the cell having a restricted signal translation system between inputs and outputs of the logic circuits affording (local) direct connection paths each selectable as to its conduction state, those paths extending, for each said logic circuit, from its output to inputs of first set of some of other said logic circuits and from its inputs to outputs of a second set of some of other said logic circuits, each first set of logic circuits being different from any other first set of logic circuits, and each second set of logic circuits being different from any other second set of logic circuits, the integrated circuit further comprises at each discrete site or cell additional optionally selectable circuit configurations selectively controlled by control means to enable each cell to operate in a selected one of two or more ways, and wherein there are a plurality of different optional circuit configurations and wherein the cells are arranged in groups, hereinafter referred to as tiles, with each tile having at least one of each of the different circuit configurations.

The selected one of two or more ways comprises either the simple logic function common to each cell or a selected subsidiary function afforded by the optionally selectable circuit configurations. The arrangements of the subsidiary functions within the cells of the tile are substantially different, and the resultant tile of cells is arranged so as to uniformly cover the array.

According to this aspect, there is provided a uniform array with externally identical cells allowing a uniform interconnect structure to be used regardless of the function of the cell. The interconnect is identical for all cells within a tile. In use the autolayout tools will know which cell supports which function but if the common function only is used then the array can be treated completely uniformly, ie. if the subsidiary functions are not used then the array appears as a uniform array of simple primary functions. There is a hierarchy of functions within the array. It is possible to implement most logic functions using the primary function only, ie. the simple cells, eg. the AND gates with programmable inversions on the inputs but this is not very efficient In order to improve the efficiency of the uniform base array it is overlaid with the subsidiary functions. The subsidiary functions represent optimised implementations of functions that can be created using the primary functions. By using this hierarchy the autolayout tools have a flexible uniform target for placement purposes for the more common functions with a slightly coarser target for the less commonly used secondary functions. The secondary functions could not be used on their own to complete a design. An hierarchy of function is preferred as opposed to an arbitrary distribution of different logic functions.

The additional or subsidiary functions are distributed throughout the array. A group of commonly used functions are selected on the basis of their frequency of occurrences within gate array designs. The selected group of functions are -distributed throughout the array as the tile, which is repeated in a regular pattern over the array. The autolayout placement target for the primary function is a cell whilst the placement target for a secondary function is a tile. Although the tile is a coarser target it still represents a uniform resource throughout the array.

In one embodiment the common simple logic function is a NAND gate. Preferably the optionally selectable circuit configurations afford optional functions of:-wired -OR output buffer—which is to be viewed as a function for the purposes of this specification; XOR; D-type flip flop (with reset and enable) and latch function (with reset and enable). Thus four different subsidiary functions are available, and the above recited function are the preferred subsidiary functions. As specified above each tile has at least one each of the available subsidiary functions. Some cells may have additional circuit configurations to facilitate by virtue of the tile arrangement building up higher level functions, for example a 2-to-1 multiplexer, or fast carry logic.

These subsidiary functions are chosen because they are functions which are commonly required and which would otherwise be arrived at by configuring several of the basic function cells. We have identified that the number of different subsidiary functions which need to be employed in configuring of an integrated circuit to perform as desired results in some subsidiary function being required more frequently than others. Thus we prefer to have the number of different subsidiary functions available to a tile reflect this. Thus we prefer to have two XOR functions to a tile. Furthermore, by having one cell offer optionally two functions (preferably the D-flip flop and latch) an advantages construction can be arrived at with a smaller tile configuration.

Our preferred tile comprises four cells, preferably arranged as a matrix of 2×2 cells, and thus in the preferred embodiment whilst there is notionally one different subsidiary function for each cell, we prefer to have two cells offering the XOR functions, one cell offering the wired-OR function and one cell offering the option of D flip flop or latch function. Each cell has available to it its basic function, ie. a NAND gate.

The preferred arrangement of 2×2 cells with the above preferred distribution of subsidiary functions is such as to naturally form efficient larger elements such as adders, counters and multiplexers.

As mentioned above for the preferred application each cell has the restricted signal translation system providing direct local interconnections between only some of the cells. However, it will be appreciated that the tiling arrangement can be utilised in circuits without this specific restricted translation system Preferably the integrated circuit has additional connection resources as described above and hereinafter according to said one aspect of the invention.

BRIEF DESCRIPTION OF THE DRAWINGS

The present invention will now be described further, by way of example only, with reference to the accompanying drawings, in which.

DETAILED DESCRIPTION OF THE PREFERRED EMBODIMENT

Figure 1:
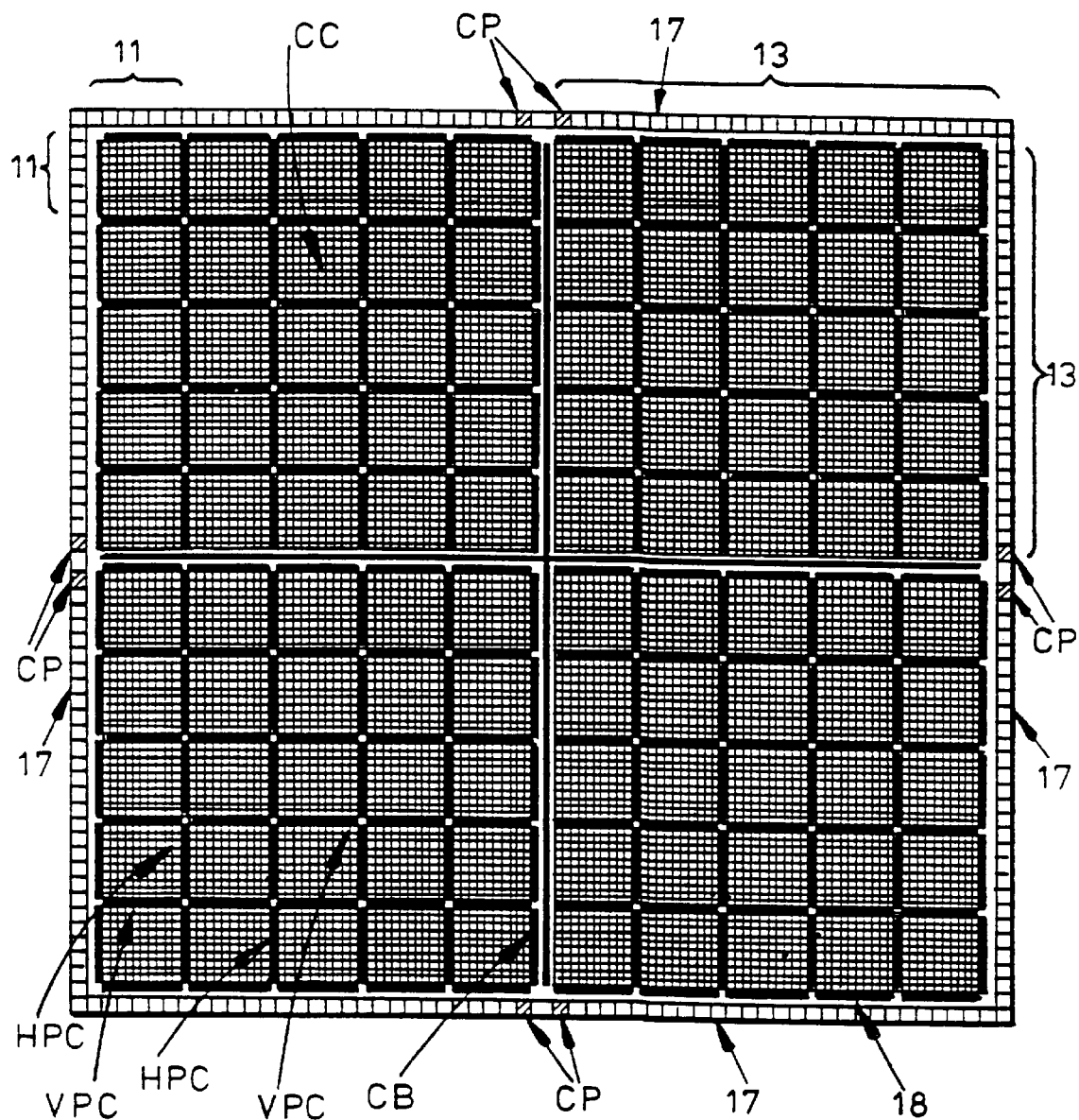
FIG. 1 is a diagrammatic representation of the hierarchical structure of a configurable logic array embodying the inventions hereof.
Figure 8:
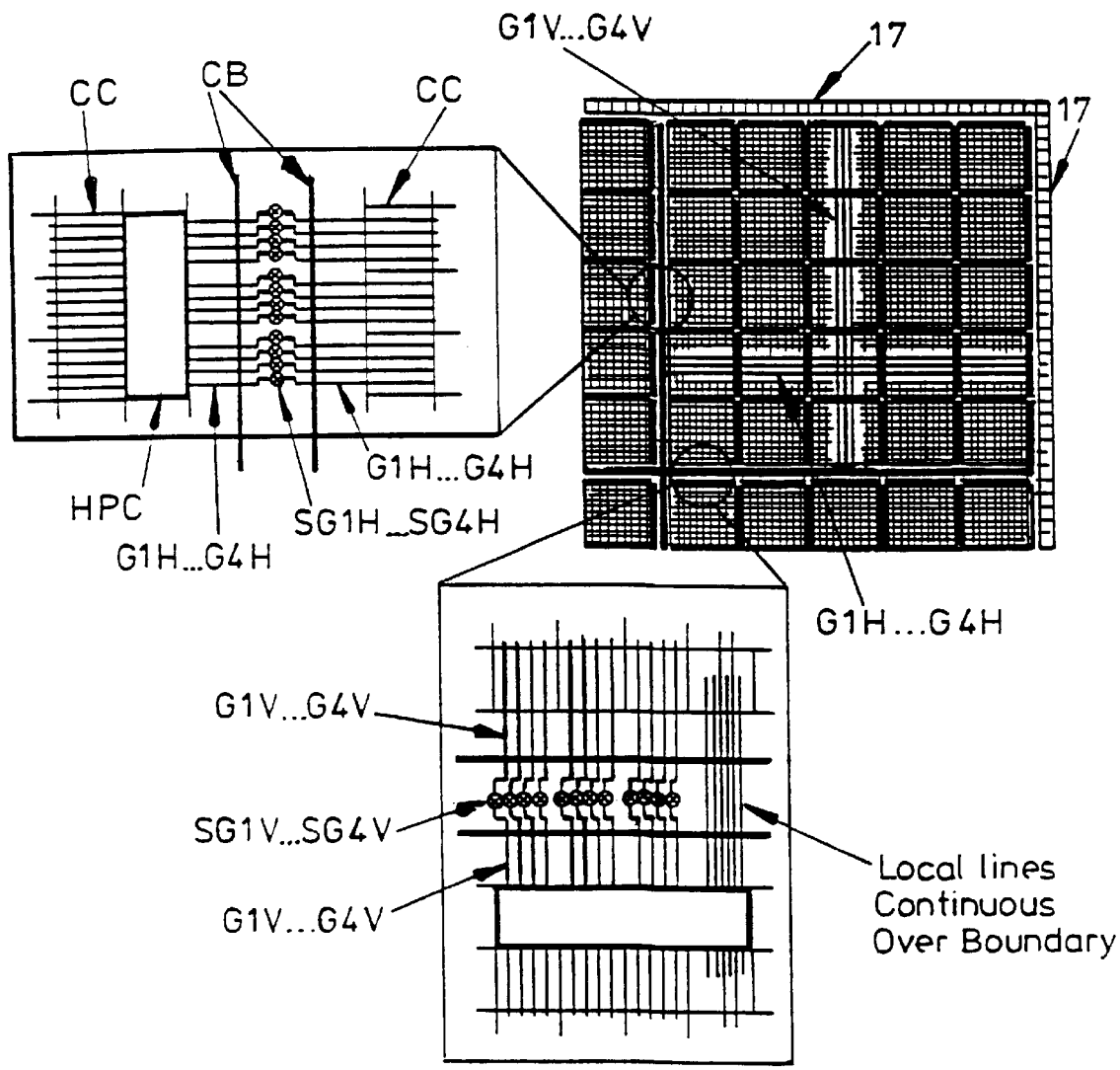
FIG. 8 illustrates diagrammatically details of connections between quadrants.
Figures 9A, 9B:
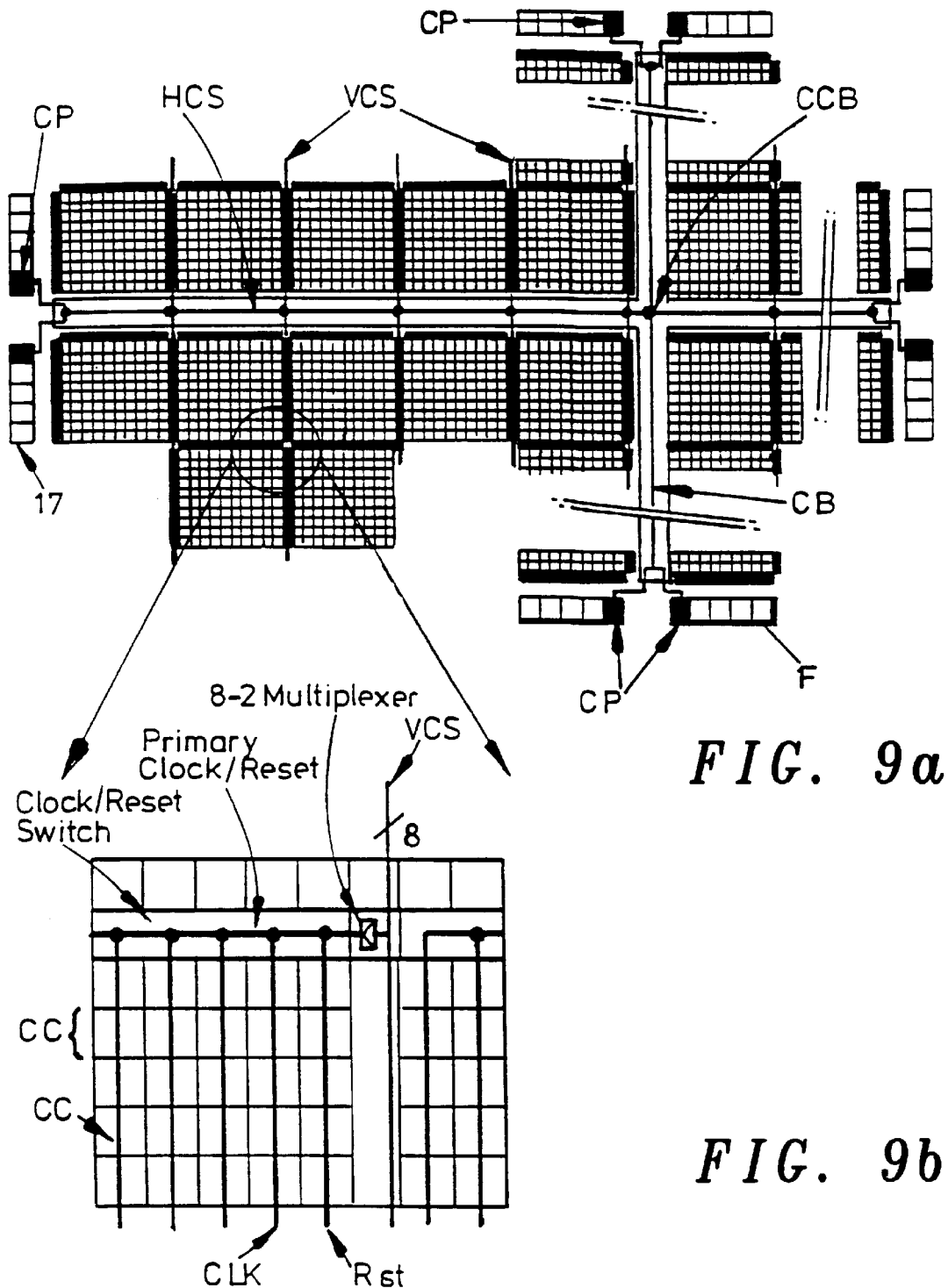
FIG. 9a illustrates diagrammatically the primary clock structure.
FIG. 9b illustrates further details of the clock structure of FIG. 9a, and FIG. 10 illustrates diagrammatically the hierarchy of interconnect provided according to the invention.

Referring firstly to FIG. 1, this illustrates an overview of the hierarchical structure of the configurable logic array embodying the inventions hereof. The array of the illustrated embodiment consists of 10,000 core cells CC, all of which can be used as a simple NAND gate. For convenience the following description describes the array as a regular array of cells, comprising rows and columns. A matrix array of 10 by 10 core cells CC with associated port cells (described further hereinafter with reference to FIGS. 6 and 7) constitutes a zone 11 (see FIG. 5a) of which there are 100 in the illustrated embodiment. A matrix array of 5 by 5 zones constitutes a quadrant 13. In the illustrated embodiment the quadrants are disposed in a 2 by 2 matrix array. Inter-quadrant switches (generally designated by reference SG see FIG. 8) are provided between the adjacent quadrants. The array is also provided with user input output cells designated by blocks 17 (FIG. 1) and the illustrated embodiment has 50 per side. Also provided are input/output multiplexers 18. The circuit also has a clock structure (including clock pads CP and clock bus CB) which is described further with reference to FIGS. 9a and 9b.

Figure 2A:
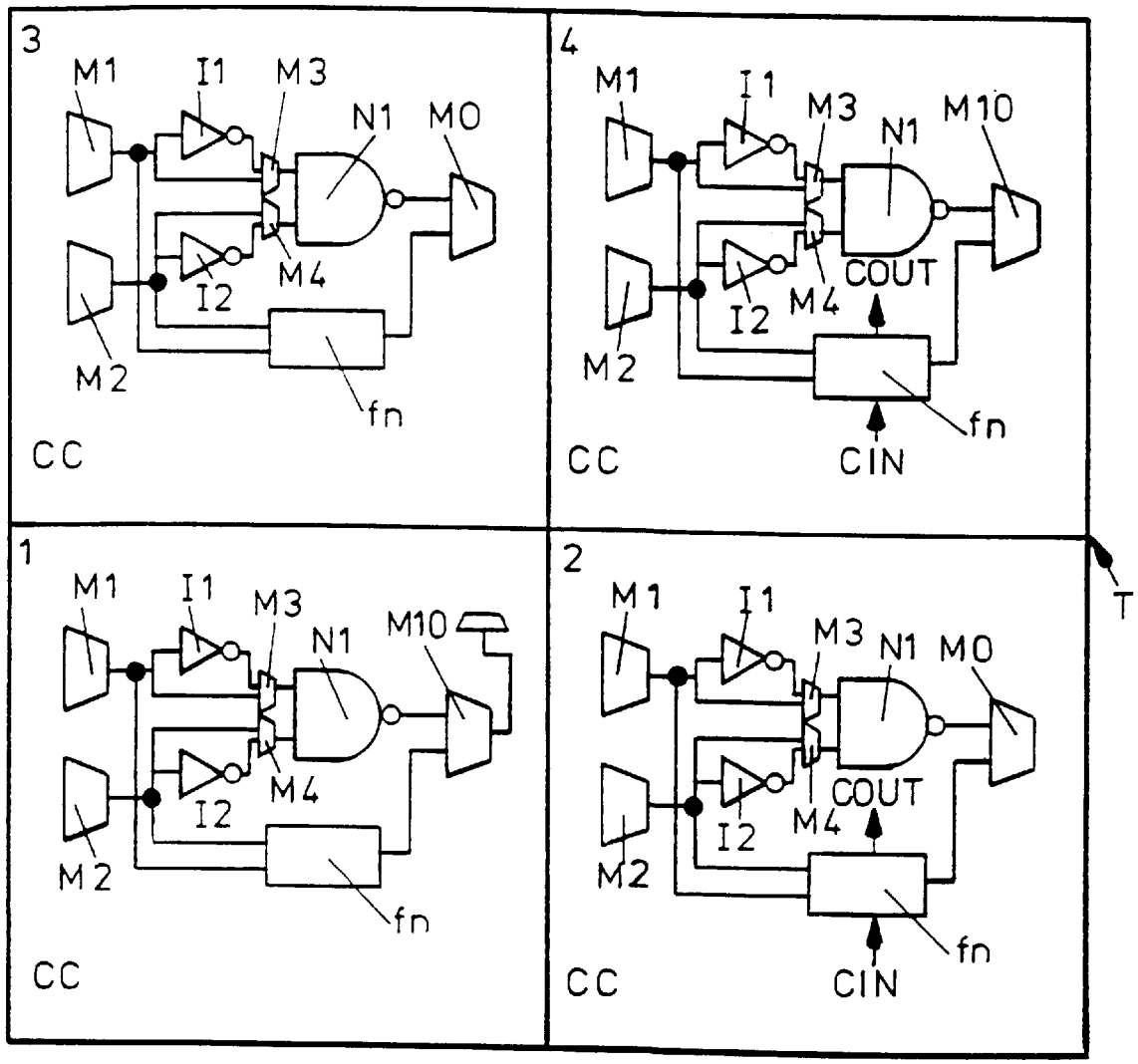
FIG. 2a shows schematically the basic function of a tile of four cells used in the array of FIG. 1.
Figure 2B:
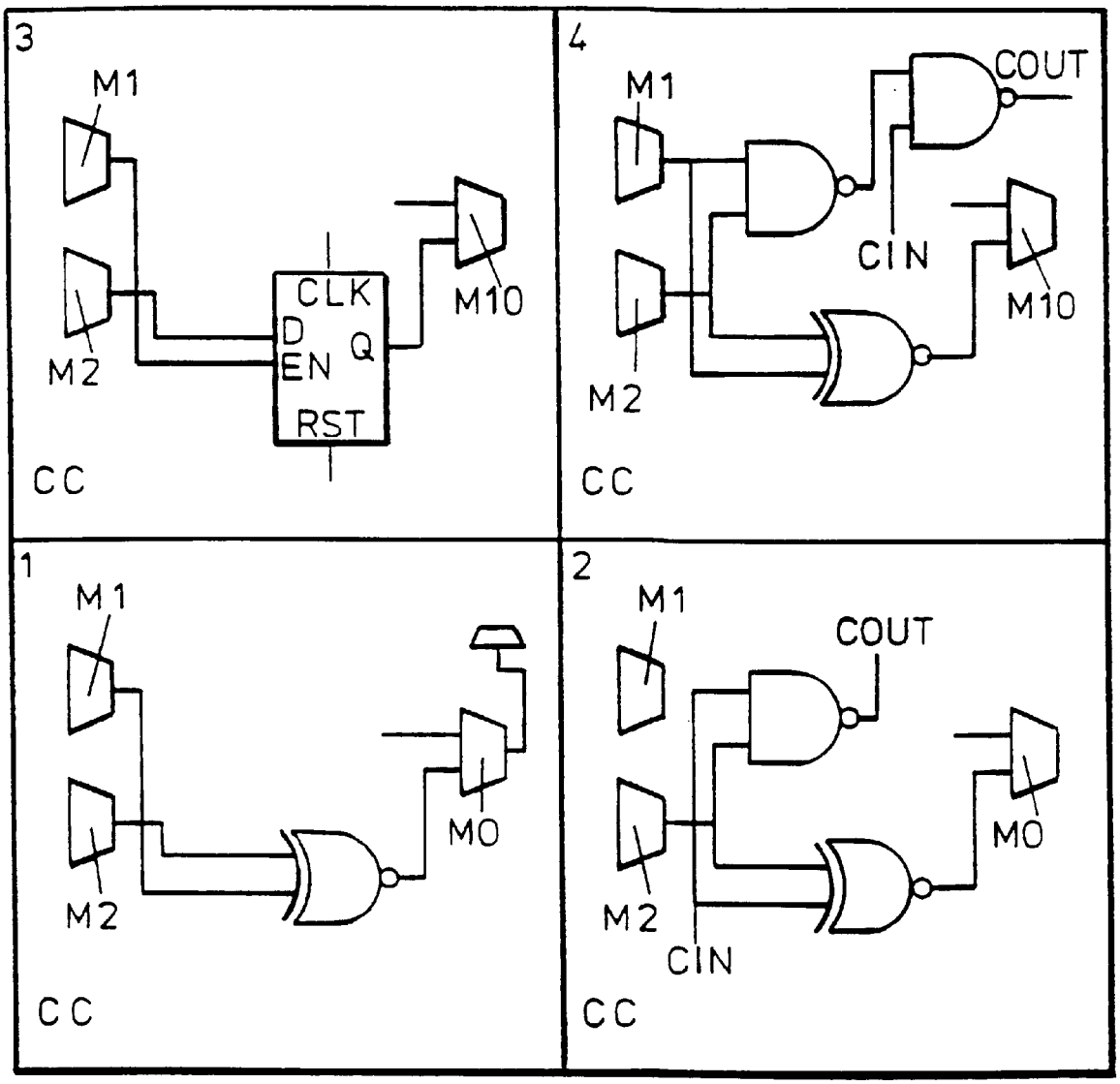
FIG. 2b shows schematically the alternative functions for each cell of the tile of four cells of FIG. 2a, FIG. 3 illustrates diagrammatically one embodiment of local connections between cells.

Referring now to FIGS. 2a and 2b, here there is illustrated diagrammatically a group of 4 core cells hereinafter referred to as a tile T and disposed in a 2 by 2 matrix array. Each cell comprises a two-input-NAND gate N1, multiplexer means M1, 2, 3 and 4 on the input side and inverters I1, I2 between respective multiplexers M1, M3, M2, M4. Each cell also has an output multiplexer M0. In addition to the facility for each core cell to be used as a simple NAND gate as represented by circuity illustrated diagrammatically in FIG. 2a, each core cell has an extra function box (fn) that can be selected during configuration. There are a plurality of different functions available and each tile contains at least one of the available functions. The 4 cells making up a tile are designated by the numbers 1, 2, 3 and 4 respectively (see FIGS. 2a, 2b) denoting different types of core cell (ie. CC-1, CC-2, CC-3, CC-4). In the illustrated embodiment the alternative function available to the type 1 cell is a wired-OR configuration, the additional function available to the type 2 cell is that of XOR as well having circuitry to provide half of a 2-to-1 multiplexer, or fast carry logic. The CIN input is driven from the type 4 cell of the tile below. The COUT output is input to the type 4 cell above. The CIN and COUT signals form the first carry logic. The type 3 cell in the illustrated embodiment has two alternative available functions, namely a D flip flop or a latch (each with reset and enable). The type 4 cell also has as its alternative function the x-OR function and additionally has the other half of the circuitry providing a 2-to-1 multiplexer or fast carry logic. The multiplexer and fast carry alternative functions require 2 core cells, thus the circuitry of the type 2 and type 4 cells are used together. In the context of the present application the wired-OR output driver of type 1 cell is to be regarded as an alternative function although strictly speaking it is not a true alternative function in the sense of the other functions. FIG. 2b shows circuitry representative of the functions available to the 4 types of core cell.

Figure 3:
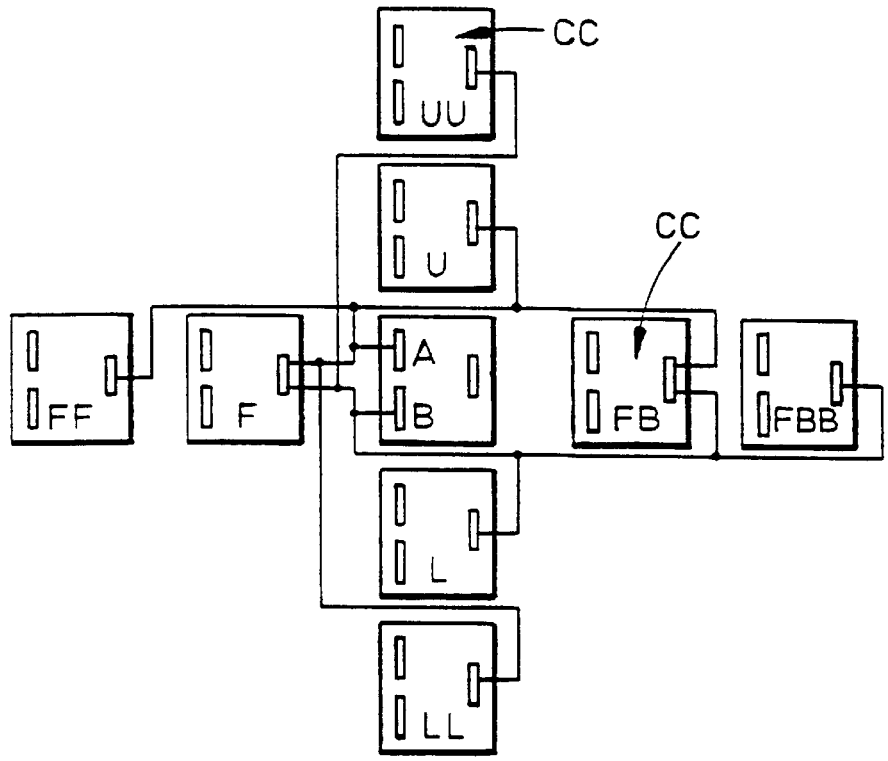
Figure 5:
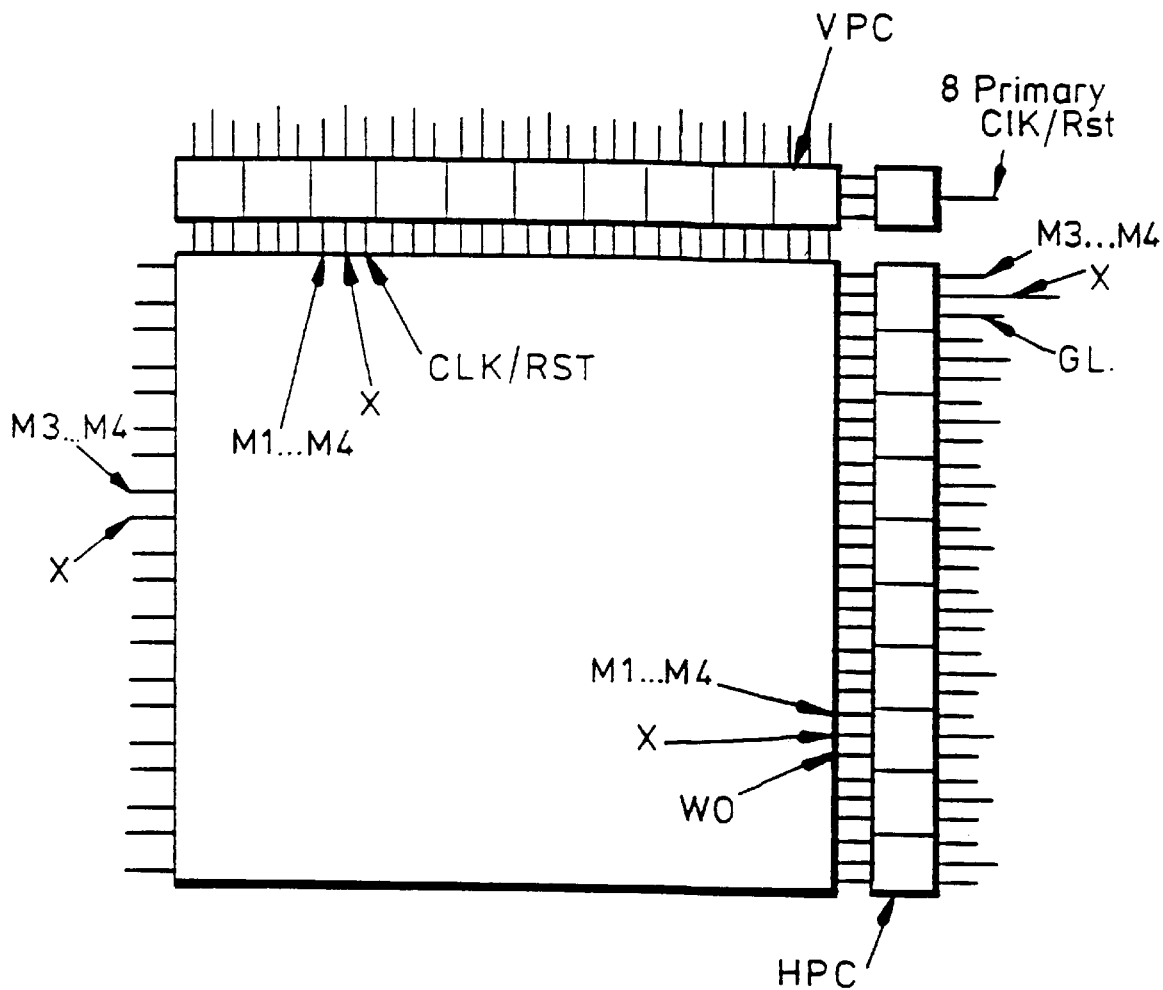
FIG. 5 illustrates diagrammatically a zone of cells and the associated vertical and horizontal port cells.
Figure 5A:
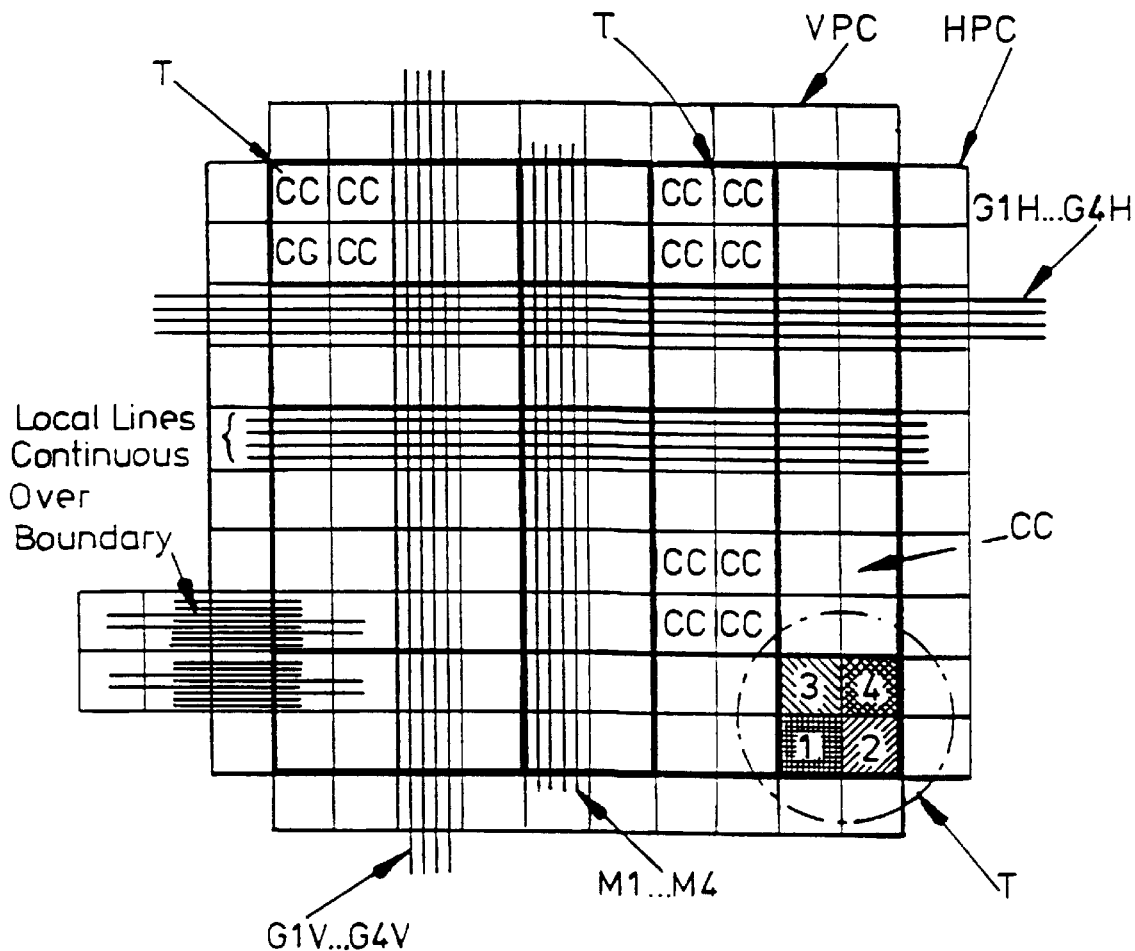
FIG. 5a shows further details of the zone of FIG. 5.
Figure 5B:
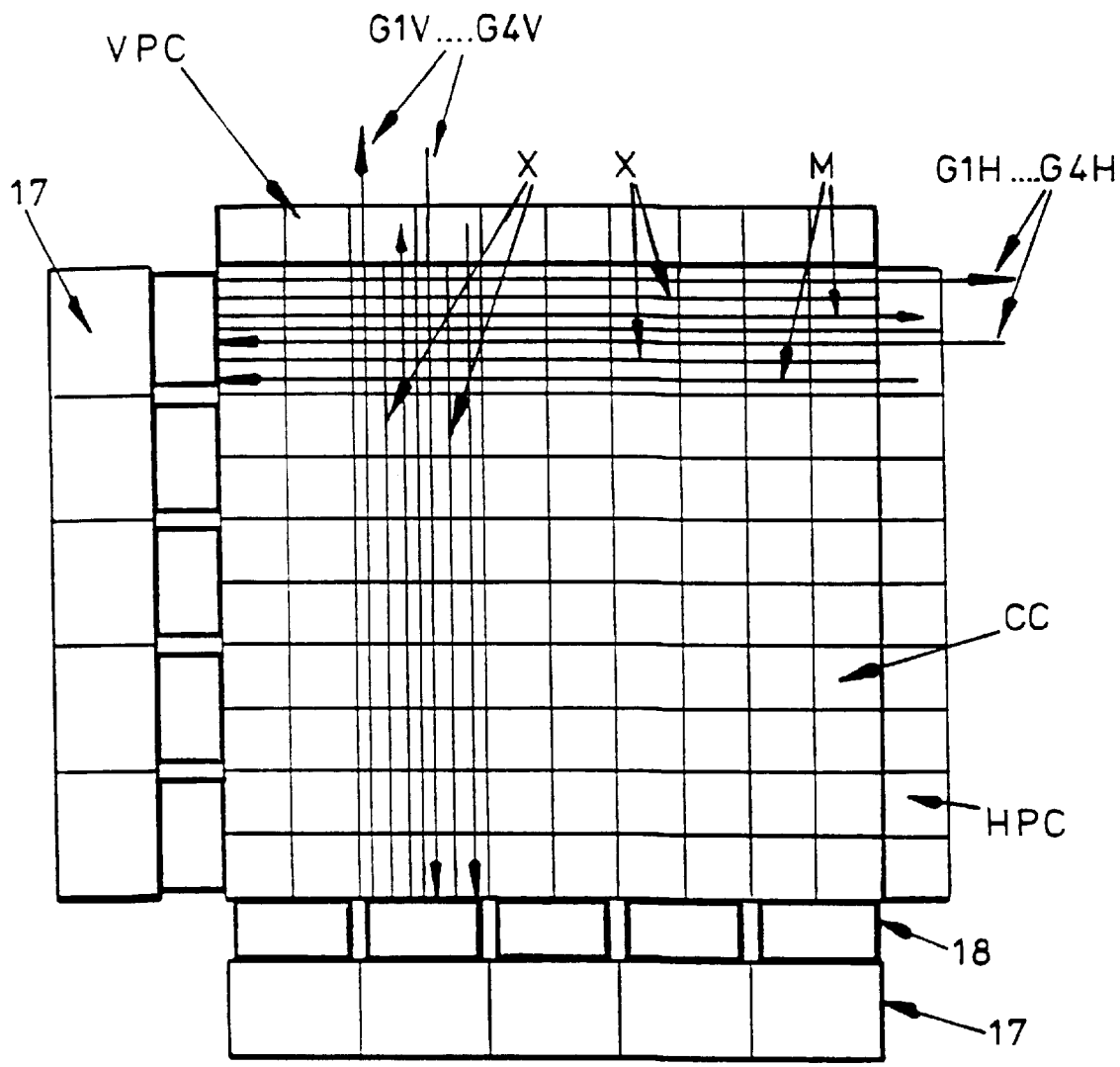
FIG. 5b illustrates a corner zone.
Figure 6:
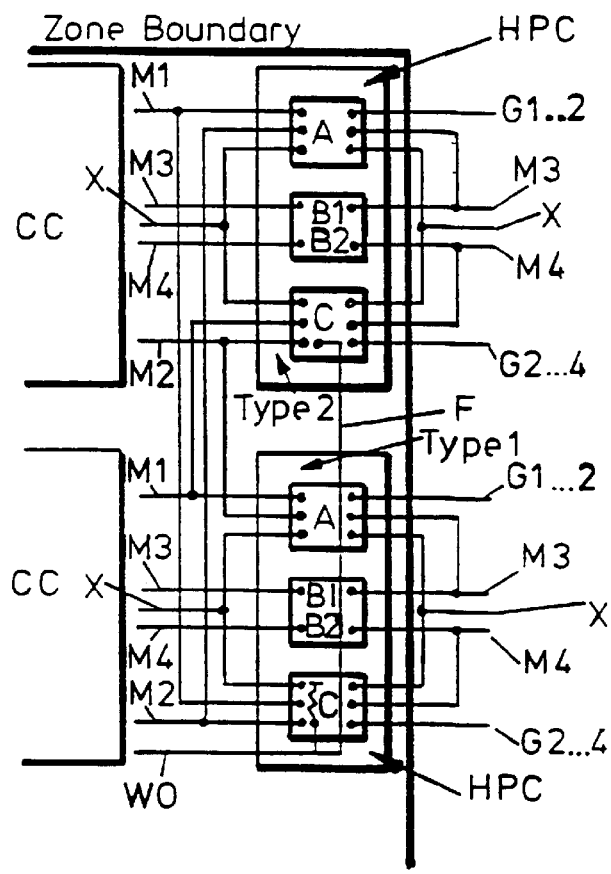
FIG. 6 illustrates diagrammatically details of connections made via the horizontal port cells.
Figure 7:
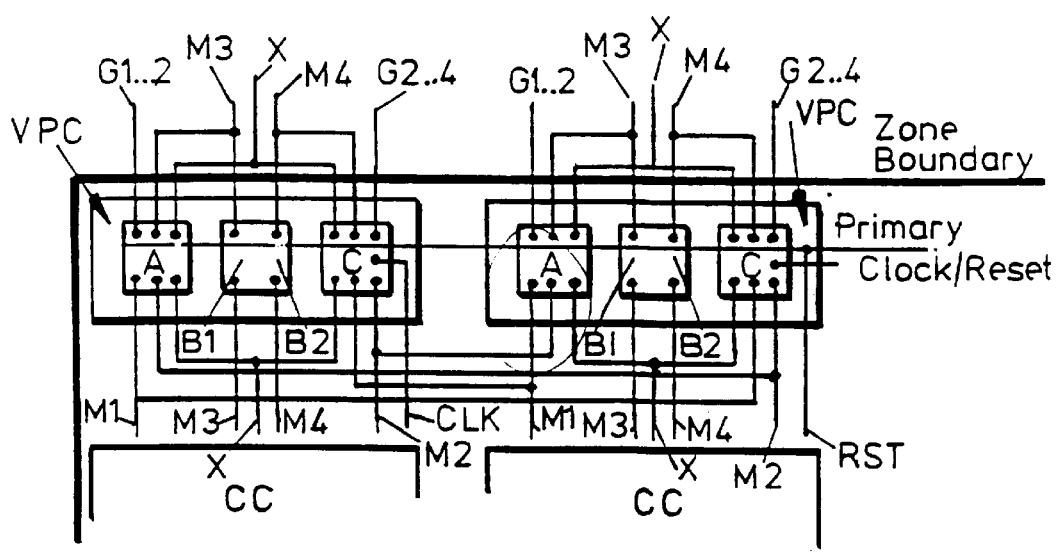
FIG. 7 illustrates diagrammatically details of connections made via the vertical port cells.

The tiles are arranged into zones as mentioned above and connections within zones are made using local interconnects described further with reference to FIG. 3, or medium range interconnect to anywhere in the zone. The latter comprise horizontal and vertical medium buses M which run the length and breadth of each zone (4 per row and column of cells). These are designated as M1, M2, M3, M4. Port cells (VPC and HPC) (FIGS. 5, 5a, 5b, 6 and 7) at the edge of each zone make connections via the medium buses to neighbouring zones or to the global bus network. Horizontal and vertical x buses (referenced x) (FIGS. 5 and 5b) also run the length and breadth of each zone (1 per row and column of cells) and in conjunction with a switch (not illustrated) in each core cell they are used for making right angled turns on these buses. Global buses G (FIG. 5a) run the length and breadth of each quadrant and in the illustrated embodiment there are 4 per row and column of core cells identified as G1, G2, G3 and G4 (FIGS. 5a, 6 and 7). Switches SG1 ... SG4 (FIG. 8) between the quadrants allow global buses-to run the whole length of the device if required.

It is envisaged that all devices will have 4 quadrants but the number of zones in each quadrant may differ from one device to another. It is however preferred to have a matrix of 10 by 10 core cells to each zone.

The global resources available to the array comprise the global interconnect lines G1 ... G4 and associated switches SG1 ... SG4. The additional letters V and H are used throughout to denote vertical and horizontal connections, cells and switches etc. as the case may be. Global resources further comprise the above-mentioned x buses described further herein below and port cells that connect between global and zone resources. There are 10 port cells along the top of each zone (the vertical port cells VPC) and 10 along the right hand side (the horizontal port cells HPC). Connections between routing resources within zones via the medium buses M1 ... M4 and the global resources are only possible through the port cells. Port cells also support connections between medium buses in adjacent zones and are used for clock and tristate net distribution described further hereinafter.

Referring now to FIG. 7 here we illustrate diagrammatically how the zone and global buses connect to the vertical port cells VPC. Port cells are arranged in pairs, aligned with the core cell tiling. Four routes are possible through each port cell-multiplexers A and C support one route each, and multiplexer B (shown as B1 and B2) supports two separate connections. Two of the zone medium buses (M1 and M2) are used for connections to the global and x buses through multiplexers A and C. In addition, M1 and M2 from the adjacent column in the tile also connect to A and C. This arrangement allows a cross over connection between pairs of port cells. Multiplexers A and C also provide bufferred connections from M1/M2 or M1/M2 in the column from the adjacent column in the tile to or from M3/4 in the zone above. The other two zone medium buses (M3 and M4) connect to multiplexers B1 and B2. B1 and 2 allow two independent unbuffered links to M3 or M4 in the zone above. M3 and M4 can be interchanged using a programmable twist. These interzone connections can be used when a fast connection is required between zones.

Alternate port cells have either a clock (CLK) or a reset (RST) multiplexer. These select the source for the dedicated clock and reset lines to the D flip flop and latch core cells, ie. the type 3 cells. The clock or reset multiplexer provides programmable inversion of clock and reset.

Figure 7A:
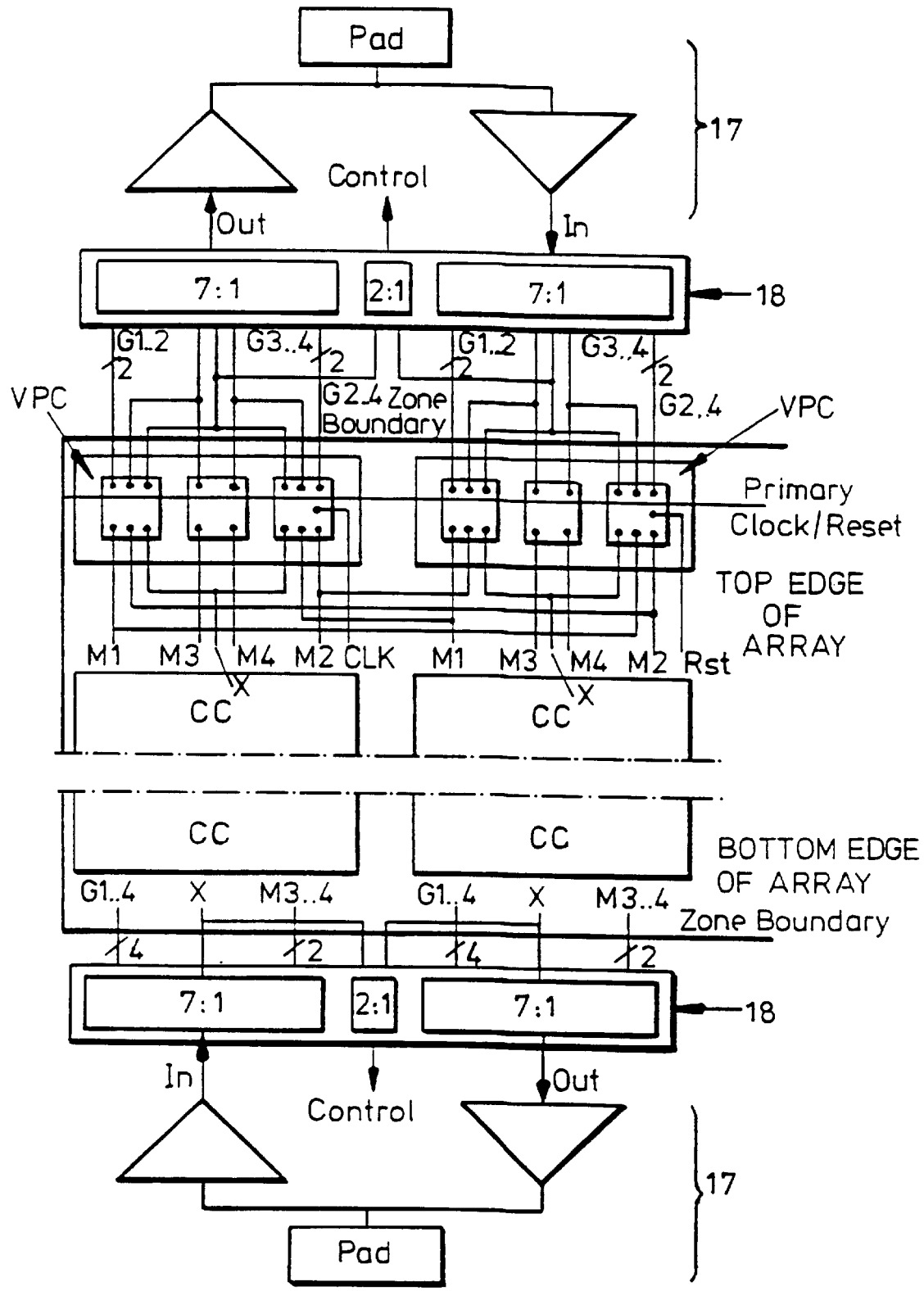
FIG. 7a illustrates diagrammatically details of connections made via the vertical port cells at the top and bottom edges of the array.

Referring now to FIG. 7a, here will illustrate the connections at the top and bottom edges of the array. At the top edge connections to the vertical port cell (VPC) are with the input/output cells 17 by way of the input/output multiplexers 18. In the illustration there are two 7:1 multiplexers and one 2:1 multiplexer for each adjacent pair of port cells. It will be seen that the lines emerging from the two horizontal port cells correspond to those of FIG. 7 and that each port cell connects with a respective 7:1 multiplexer. In addition the two x buses from each port cell have a branch into the 2:1 multiplexer which communicates with control circuitry.

At the bottom edge of the array, the lines passing over the zone boundary also connect with input/output cells 17 via multiplexers. For two adjacent cells also comprises a respective 7:1 multiplexer and a common 2:1 multiplexer. The lines comprise Global lines (G1 ... 4), the x bus and medium interconnect lines M3, M4. The respective x buses are branched to the 2:1 multiplexer as at the top edge. Note in each case one 7:1 multiplexer feeds to an output cell 17 OUT and one is fed from an input cell 17 IN.

In the illustrated embodiment, the input/output connection at the edges mirror the connections between zones. This is not to be taken as limiting, merely an example and the connection to the input/output multiplexers may be for more extensive. For example other of the medium interconnect lines may be substituted for M3, M4 or supplement them. In the illustrated embodiment the medium interconnect lines M1, M2 terminate at the lowermost cell of each zone, ie. they do not pass over the zone boundary.

The connections to the input/output cells of the right and left edges of the array according to one embodiment mirror the connections to the horizontal port cells (HPC) as illustrated in FIG. 6 in a corresponding manner to the arrangement of FIG. 7b, utilising two 7:1 multiplexers for each pair of adjacent cells and a corresponding 2:1 multiplexer for the x buses.

The primary clock structure will now be described. Primary clocks may originate external to the device via 8 special purpose-clock pads CP or from the array by routing on general resource to the clock pads. The clock pads CP are situated at the corner of each quadrant (see FIG. 1) and illustrated in further detail with reference to FIG. 9a which is a chip level diagram. The clock bus CB runs vertically between the top and bottom clock pads CP and connects with a horizontal clock spine HCS (having 8 lines) running between the horizontal clock pads to opposite sides of the array. A central clock buffer CCB is disposed at the intersection of the vertical clock bus CB and the horizontal clock spine or bus (HCS). A total of 8 global signals (clocks or reset clocks) may be driven; these can be either internally or externally generated. Any normal user I/O input signal may also be used as a primary clock by simply routing it internally to one of the clock pads. The horizontal clock spine is tapped off at various points to drive multiple vertical clock spines VCS which run between adjacent zones to provide one vertical channel of 8 global clock signals per column of array zones In addition there are equivalent vertical channels for the I/O zones to the left and right hand sides of the device. The I/O zones to the top and bottom of the array connect to the vertical clock distribution channels driven up and down through the array. The primary clock and reset signals are input into the vertical port cells of each zone via the zone clock and reset cells. An 8-2 multiplexer (FIG. 9b) distributes signals from the VCS into the vertical port cell VPC and as described with reference to FIG. 7 alternate core cells CC have a clock switch or a reset switch whereby clock (CLK) or reset (RST) signals can be distributed vertically through the zone (see also FIG. 9b).

Secondary clocks can also be provided using conventional routing resource of the circuit. A routing comb is created by the software consisting of the horizontal spine and vertical teeth. The spine and teeth are routed on global interconnect and connected via x bus switches. The global interconnect may be extended across quadrant switches. The clocks are input into zones via the zones vertical port cells (which also provide programmable clock inversion), the clock can only be connected to flip flops on the same column as the secondary clock. Tertiary clocks may also be provided using conventional routing resource and our input into zones via the zones vertical port cells and can be routed on any level of interconnect.

Referring now to FIG. 6 which illustrates detailing of the horizontal port cell HPC. These provide the same medium, global and x bus connectivity as the vertical port cell described above. Since the primary clock and reset signals are distributed only from the vertical core cells down core cell columns, the horizonal port cell contains no clock/reset logic. Instead, it provides support for tristate buses. Tristates are implemented using a dedicated horizontal bus within the zone (the WO bus) plus the horizonal global interconnect. The wired -OR output from the type 1 cell subsidiary function is connected to the horizontal port cell via the dedicated horizontal WO bus. The WO bus connects to multiplexer C in the horizontal port cells The internal multiplexers for normal interconnect are the same as those for the vertical port cells.

The functional tiling within the zones means that only half the core cell rows contain core cells with wired-OR drivers. Therefore, there are only five wired-OR buses per zone. This means that there have to be two types of port cell, one with zone wired-OR bus connecting to it (type 1), and one without (type 2). The zone wired-OR bus from the type 1 horizontal port cell is fed to the type 2 cell as indicated by line F. This means that a WO bus can drive into horizontal global buses in every row. The x bus can also make a wired-OR connection onto the global buses, allowing vertical steps between wired-OR buses This connection can be inverted as required to maintain the sense of signals.

With regard to the global interconnections, horizonal and vertical global buses run across each quadrant connecting to each zone via its port cells, see FIGS. 5, 5a, 6 and 7. The global buses connect to the I/O cells at the periphery of the device.

There are 200 user configurable I/O cells 17 and these are arranged so that they pitch match 1 to every two core cells around the edges of the device. Global, medium and x buses (G1 . . . G4, M1 . . . M2 or M3 . . . M4, X) from one core cell row or column are used as inputs and G1 . . . G4, M1 . . . M2 or M3 . . . M4 and X from the adjacent row or column are used as outputs. An 8 bit peripheral bus runs around the whole device which is accessed by the I/O cells. Each I/O cell can read or write any of the 8 bits. Wired-OR buffers can optionally be selected when writing to the peripheral bus.

Referring again to FIG. 5, the basic structure of a zone is illustrated showing the vertical port cells VPC and the horizontal port cells HPC described with reference to FIGS. 7 and 6 respectively. Also illustrated is the zone CLK/RST multiplexer. Referring to FIG. 3, regarding the local interconnect of each cell, the upper and lower input multiplexers (A and B) of each core cell can be connected to the outputs of nearby cells using the network of local interconnect. This provides the fastest connections between cells. Thus in the illustrated embodiment the multiplexer A provides inputs to the core cell C from the outputs of cells U, LL, F, FB and FF, whilst the multiplexer B provides inputs to the core cell C from the outputs of cells UU, L, F, FB and FBB. Thus in the illustrated embodiment each cell connects with its eight nearest perpendicular neighbours. Each cell C will have a set of local connection possibilities. Ie. each cell connects with only some of the other cells in a manner described in our British patent 2180382.

Figure 4:
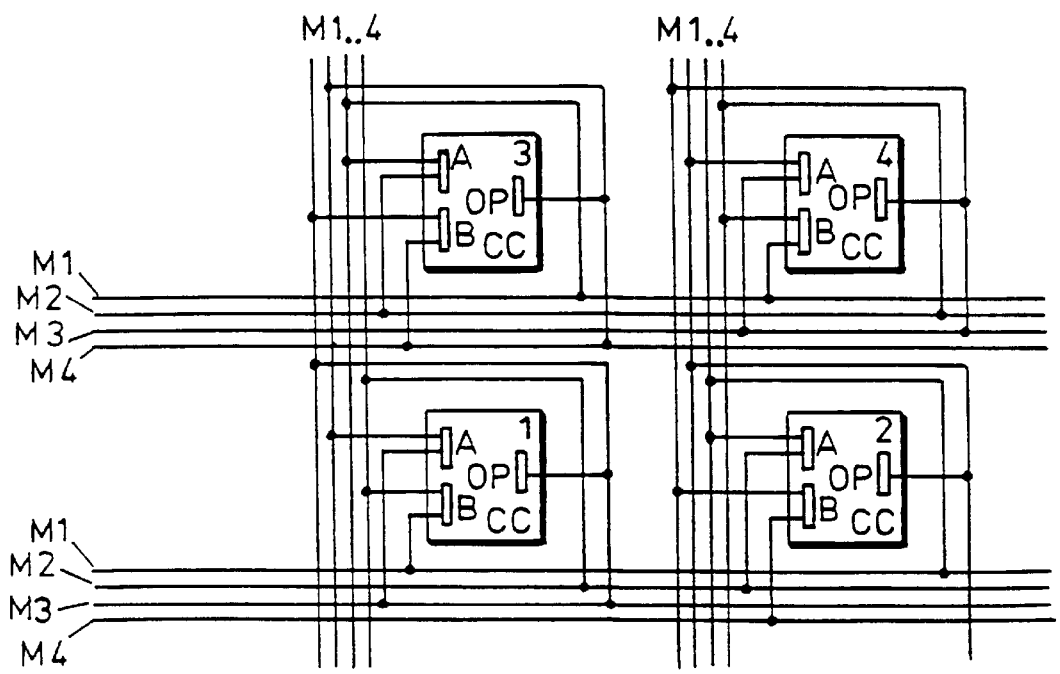
FIG. 4 illustrates diagrammatically one series of medium connection paths to the four cells of a tile.

Referring now to FIG. 4, this illustrates how medium interconnect is used for connections within a zone that are not possible with local interconnect. Medium buses are also used for interzone connections since they connect to the port cells. There are four horizontal and four vertical medium buses per row and column of core cells. All medium buses connect to the zones port cells, but only two can be used for connection to the global routing network in the illustrated embodiment and these are referred to as M1 and M2 or the external medium buses. M3 and M4 "the internal" medium buses, are used for connections through the port cells to all four adjacent zones as will be apparent from reference to FIG. 6 and 7.

Each of the two input multiplexers in a core cell provides connections from two medium buses. The core cell output multiplexers can connect to four medium buses. Therefore each individual core cell can only access half the 8 medium buses that cross each cell. To compensate for this there is a tiling of bus connections, using two different sets of connections, repeated in a 2 by 2 tile similar to the core cell functional tiling Thus, for the illustrated embodiment each core cell in the tile connects to its horizontal and vertical medium buses as set out in table 1 below.

TABLE 1

| Core cell | Mux | Connections from: | Connections to: |
|---|---|---|---|
| 2/3 | A | M3(Vert),M2(Horiz) | — |
| 2/3 | B | M1(Vert),M4(Horiz) | — |
| 2/3 | OP | — | M2,M3(Vert),M1,M4(Horiz) |
| 1/4 | A | M2(Vert),M3(Horiz) | — |
| 1/4 | B | M4(Vert),M1(Horiz) | — |
| 1/4 | OP | — | M1,M4(Vert),M2,M3(Horiz) |

Figure 10:
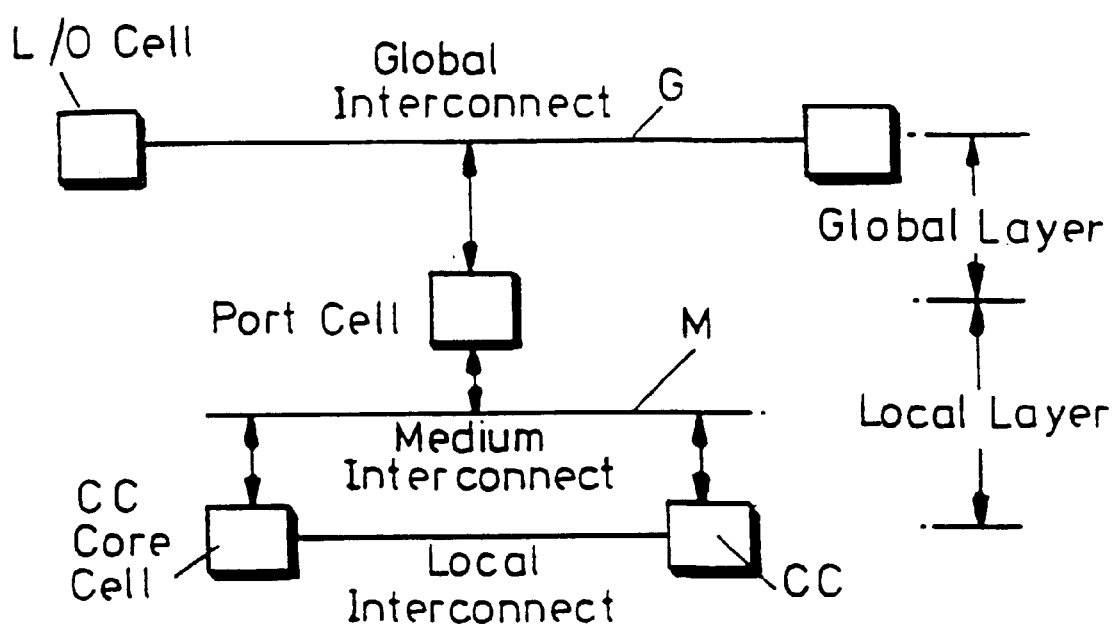

FIG. 10 illustrates diagrammatically for illustrative purposes the hierarchy of interconnect and shows three interconnect structures, namely firstly, the local interconnect structures which only have the scope of a few cells, and cannot connect to port cells, secondly the medium interconnect structures (M) which only have the scope of a single zone but can directly connect with port cells and core cell, and thirdly the global interconnect (G) which can span the whole array but cannot connect to core cells (CC). It will be apparent that these three levels of interconnect will be brought about by the existence of the porting arrangement that separates the array into zones. The global level of interconnect is separated from the medium and local levels of interconnect by the porting arrangement.

We claim:

1. A programmable logic array, comprising:
    a plurality of logic cells arranged into rows and columns, wherein a first zone of a plurality of zones includes first and second adjacent logic cells, and a second zone includes third and fourth adjacent logic cells;
    a first medium interconnect bus routed horizontally and vertically along the plurality of logic cells in the first zone coupling the first logic cell to the second logic cell;
    a second medium interconnect bus routed horizontally and vertically along the plurality of logic cells in the second zone coupling the third logic cell to the fourth logic cell; and
    a port cell programmably connecting the first medium interconnect bus and the second medium interconnect bus for coupling the first logic cell in the first zone to the third logic cell in the second zone.

2. The programmable logic array of claim 1 wherein each respective zone of the plurality of zones includes a medium interconnect bus for coupling adjacent and non-adjacent logic cells within the respective zone.

3. The programmable logic array of claim 2 wherein each respective zone of the plurality of zones includes a plurality of port cells surrounding the respective zone coupling the medium interconnect busses between adjacent zones.

4. The programmable logic array of claim 3 wherein each respective zone of the plurality of zones includes a local interconnect bus for coupling adjacent logic cells within the respective zone.

5. The programmable logic array of claim 2 further including a plurality of quadrants wherein a first quadrant includes the first and second zones, and a second quadrant includes third and fourth zones.

6. The programmable logic array of claim 5 further including a global interconnect bus routed horizontally and vertically along the plurality of quadrants for coupling logic cells located in different quadrants, wherein a logic cell in the first zone is coupled via the first medium interconnect bus in the first zone of the first quadrant to the global interconnect bus and the global interconnect bus is coupled via a medium interconnect bus in the third zone of the second quadrant to a logic cell in the third zone.

7. The programmable logic array of claim 6 further including an interquadrant switch coupled in the global interconnect bus at boundaries of the plurality of quadrants.

8. The programmable logic array of claim 1 wherein the first logic cell includes:
    a first logic gate having first and second inputs coupled to first and second inputs of the first logic cell;
    a logic function block having a first input coupled to the first input of the first logic cell; and
    a first multiplexer having a first input coupled to an output of the first logic gate, a second input coupled to an output of the logic function block, and an output coupled to an output of the first logic cell.

9. The programmable logic array of claim 8 wherein the first logic cell further includes:
    a second multiplexer having first and second inputs coupled to the first and second inputs of the first logic cell and an output coupled to the first input of the first logic gate and to the first input of the logic function block; and
    a third multiplexer having first and second inputs coupled to third and fourth inputs of the first logic cell and an output coupled to the second input of the first logic gate and to a second input of the logic function block.

10. The programmable logic array of claim 9 wherein the first logic cell further includes:
    a fourth multiplexer having a first input coupled to the output of the second multiplexer and an output coupled to the first input of the first logic cell; and
    an inverter having an input coupled to the output of the second multiplexer and an output coupled to a second input of the fourth multiplexer.

11. The programmable logic array of claim 10 wherein the logic function block includes at least one of a wired-OR logic function, an exclusive-OR logic function, a latch function, a portion of a multiplexer function, and a portion of a fast carry logic function.

12. A method of interconnecting a logic array, comprising the steps of:
    arranging a plurality of logic cells into a plurality of zones, wherein a first zone includes first and second adjacent logic cells, and a second zone includes third and fourth adjacent logic cells;
    providing a medium interconnect bus within each respective zone of the plurality of zones for coupling adjacent and non-adjacent logic cells within the respective zone; and
    programmably connecting a first medium interconnect bus in the first zone and a second medium interconnect bus in the second zone.

13. The method of claim 12 further including the step of providing a plurality of port cells surrounding each respective zone of the plurality of zones for coupling the medium interconnect busses between adjacent zones.

14. The method of claim 13 further including the step of providing a local interconnect bus in each respective zone of the plurality of zones for coupling adjacent logic cells within the respective zone.

15. The method of claim 12 further including the step of providing a plurality of quadrants wherein a first quadrant includes the first and second zones, and a second quadrant includes third and fourth zones.

16. The method of claim 15 further including the step of providing a global interconnect bus routed horizontally and vertically along the plurality of quadrants for coupling logic cells located in different quadrants, wherein a logic cell in the first zone is coupled via a medium interconnect bus in the first zone of the first quadrant to the global interconnect bus and the global interconnect bus is coupled via a medium interconnect bus in the third zone of the second quadrant to a logic cell in the third zone.

17. A programmable logic array, comprising:
    a plurality of logic cells arranged into a plurality of zones, wherein a first zone includes first and second adjacent logic cells, and a second zone includes third and fourth adjacent logic cells;
    a medium interconnect bus for coupling adjacent and non-adjacent logic cells within each of the plurality of zones; and a plurality of port cells surrounding each of the plurality of zones coupling the medium interconnect busses between adjacent zones.

18. The programmable logic array of claim 17 further including a plurality of quadrants wherein a first quadrant includes the first and second zones, and a second quadrant includes third and fourth zones.

19. The programmable logic array of claim 18 further including a global interconnect bus routed horizontally and vertically along the plurality of quadrants for coupling logic cells located in different quadrants, wherein a logic cell in the first zone is coupled via a medium interconnect bus in the first zone of the first quadrant to the global interconnect bus and the global interconnect bus is coupled via a medium interconnect bus in the third zone of the second quadrant to a logic cell in the third zone.

20. The programmable logic array of claim 17 wherein the first logic cell includes:
- a first logic gate having first and second inputs coupled to first and second inputs of the first logic cell;
- a logic function block having a first input coupled to the first input of the first logic cell; and
- a first multiplexer having a first input coupled to an output of the first logic gate, a second input coupled to an output of the logic function block, and an output coupled to an output of the first logic cell.

* * * * *